United States Patent
Su et al.

(10) Patent No.: US 6,696,752 B2
(45) Date of Patent: Feb. 24, 2004

(54) ENCAPSULATED SEMICONDUCTOR DEVICE WITH FLASH-PROOF STRUCTURE

(75) Inventors: Guo-Kai Su, Taichung Hsien (TW); Fu-Di Tang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/862,347

(22) Filed: May 22, 2001

(65) Prior Publication Data

US 2001/0042915 A1 Nov. 22, 2001

(30) Foreign Application Priority Data

May 22, 2000 (TW) .................................. 89109804 A

(51) Int. Cl.⁷ .............................................. H01L 23/02
(52) U.S. Cl. ...................... 257/678; 257/666; 257/667; 257/704
(58) Field of Search .................. 257/678, 787, 257/667, 670, 676, 671, 680, 704, 710

(56) References Cited

U.S. PATENT DOCUMENTS

| | | | |
|---|---|---|---|
| 5,070,039 A | * 12/1991 | Johnson et al. | 437/207 |
| 5,070,041 A | * 12/1991 | Katayama et al. | 437/214 |
| 5,106,784 A | * 4/1992 | Bednarz | 437/214 |
| 5,177,591 A | * 1/1993 | Emanuel | 257/674 |
| 5,441,684 A | * 8/1995 | Lee | 264/135 |
| 5,703,396 A | * 12/1997 | Kurihara | 257/692 |
| 5,859,471 A | * 1/1999 | Kuraishi et al. | 257/666 |
| 5,909,058 A | * 6/1999 | Yano et al. | 257/712 |
| 5,920,116 A | * 7/1999 | Umehara et al. | 257/669 |
| 5,990,545 A | * 11/1999 | Schueller et al. | 257/697 |
| 6,018,189 A | * 1/2000 | Mizuno | 257/668 |
| 6,040,093 A | * 3/2000 | Yuzawa | 430/5 |
| 6,043,108 A | * 3/2000 | Izumi et al. | 438/111 |
| 6,046,495 A | * 4/2000 | Urushima | 257/668 |
| 6,058,602 A | * 5/2000 | Fehr | 29/827 |

FOREIGN PATENT DOCUMENTS

| | | | | |
|---|---|---|---|---|
| JP | 56048155 A | * | 9/1979 | H01L/23/04 |
| JP | 62229949 A | * | 10/1987 | H01L/21/56 |
| JP | 407038035 | * | 2/1995 | H01L/23/50 |
| JP | 407038035 A | * | 2/1995 | H01L/23/50 |

* cited by examiner

*Primary Examiner*—Amir Zarabian
*Assistant Examiner*—Monica Lewis
(74) *Attorney, Agent, or Firm*—Peter F. Corless; Steven M. Jensen; Edwards & Angell, LLP

(57) ABSTRACT

An encapsulated semiconductor device includes a lead frame formed with a flash-proof body. The flash-proof body includes a dam bar formed on atop surface of the lead frame and a tape adhered to a bottom surface of the lead frame, where the dam bar is attached to both the lead frame and the tape. The semiconductor device further includes an encapsulation body having a core-hollowed portion integrated with the lead frame, the core-hollowed portion being bordered by the dam bar and the tape so that a semiconductor chip and conductive elements are exposed in the encapsulation body. A lid can be adhered to the encapsulation body to air-tightly seal the semiconductor chip and encapsulation elements in the core-hollowed portion.

19 Claims, 3 Drawing Sheets

ENCAPSULATED SEMICONDUCTOR DEVICE WITH FLASH-PROOF STRUCTURE

FIELD OF THE INVENTION

The present invention relates to semiconductor packages and the method for manufacturing the same and, more particularly, to a semiconductor package having a semiconductor chip and bonding wire exposed to a core-hollowed portion on said encapsulation body.

BACKGROUND OF THE INVENTION

With the development of electronic products, semiconductor packages are rapidly developed with the trends of manufacturing electronic devices of high performance and miniaturization. Therefore, surface built-in semiconductor packages such as QFP (Quad Flat Package), BGA (Ball Grid Array), TSOP (Thin Small Outline Package) and image sensor devices are widely used for the resin encapsulated semiconductor packages.

Structures of the aforesaid image sensing device is to mount an image-sensor semiconductor chip inside an encapsulation body having a core-hollowed portion. Then, after performing wire bonding to the chip, hermetically seal a transparent lid over the opening of the core-hollowed portion of the encapsulation body. In the configuration of an image-sensor chip package, however, there was involved such a problem that because flashes of the resin are formed on the surface of the lead frame during the molding process, the resulting quality of the die attachment and wire bonding on the flashed parts of the lead frame are found to become bad. In order to solve the foregoing problem, many ways for de-flashing are disclosed, for example, U.S. Pat. No. 5,070,041 disclosed a semiconductor packaging method by removing resin flash built up on lead frame without damaging resin molded section.

This patented method comprises the steps of: (1) coating an layer of high molecular organic substance over the areas of the lead frame that are uncovered by the encapsulation body wherein the high molecular organic substance has a melting point higher than the molding temperature of a resin constituting the encapsulation body; (2) injecting the resin into the mold and obtaining a core-hollowed portion of encapsulation body integrated with the lead frame; (3) using a special solvent to wash away the high-molecule organic coating, whereby the resin flash can be removed together with the high-molecule organic coating; (4) mounting semiconductor chip onto the flash-free die pad and wire-bonding electrodes of the semiconductor chip to the lead frames; (5) hermetically sealing a transparent lid to the opening of the core-hollowed portion of the encapsulation body.

The above-mentioned patented method is preferred than other prior art designs, bit it still has the following drawbacks. First, the solvent for removing the high molecular organic substances would cause pollution to the environment. Improper post-treatment of the solvent would raise environmental issue and thus, the cost is increased. Further, the step of coating high-molecule organic substance and the subsequent step of dissolving the coating to remove resin flash are quite complicated in procedure and costly to implement, therefore making the overall fabrication process quite cost-ineffective. Moreover, it is required to implement new facility and procedure than prior art to effectively remove the solvent containing high molecular organic substances, and therefore increase the cost of the overall fabrication process. In addition, after the organic high indecular substances dissolved in the solvent, the die-bonding and wire-bonding processes are not allowed to perform until the solvent being removed, which increases the fabrication time and reduces the production rate.

SUMMARY OF THE INVENTION

Accordingly, an object of the present invention is to provide an encapsulated semiconductor divice having a flash-proof structure and a manufacturing method thereof, by which resin flash formed on a lead frame is prevented during the molding process and therefore provide higher reliability of the semiconductor packaging device and the manufacturing cost is low so as to assure the quality in the package.

To achieve the aforesaid object, the present invention provides a process for producing an encapsulated semiconductor device having a flash-proof body, the process comprising the steps of: providing a lead frame with a flash-proof body on the lead frame so that a top of the lead frame in the flash-proof body is isolated from the other portion of the lead frame out of the flash-proof body; further, a die bonding area is formed on a portion at the top surface of the lead frame within the flash-proof portion and a wire bonding section at an outer side of the die bonding area; positioning the lead frame integrated in the flash-proof body within a mold and filling resin into the mold, thereby obtaining an encapsulation body having a core-hollowed portion integrated with part of the lead frame so that the encapsulation body encapsulates part of the lead frame are exposed within the core-hollowed portion of the encapsulation body; die-bonding a semiconductor chip to the top surface of the die pad on the lead frame; wire bonding to electrically connect the semiconductor chip to the wire bonding area on the lead frame; and attaching a lid to the encapsulation body to hermetically seal the whole core-hollowed portion of the encapsulation body.

In one preferred embodiment, the flash-proof body is constituted by a dam bar and a tape adhered to the dam bar. The dam bar is formed on an top surface of the lead frame while the tape is adhered onto the bottom surface of the lead frame. And further, the dam bar is adhered to the lead frame and the tape. The dam bar is protruded from a top surface of the lead frame with a proper height and is tightly adhered to the tape at the bottom surface thereof so that the top surface of the lead frame enclosed by the dam bar (i.e., die bonding area and wire bonding area) is completely isolated from the other part of the lead frame out of the dam bar and the tape. Therefore, in the molding process, the edge of the core-hollowed forming block of the encapsulation body used in the molding process will press hardly against the dam bar on the lead frame, thereby an enhanced contact between the dam bar and core-hollowed forming block is achieved. The foregoing arrangement can prevent the melted resin flowing into the die bonding area and the wire bonding area on the laed frame, and can prevent the formation of the resin flash occurred thereof.

In another preferred embodiment of the present invention, a groove portion formed by conventional etching techniques is positioned in a manner underlying the location of the dam bar on the lead of the lead frame. The groove portion according to the present inventin is used to limit the formation range of the dam bar on the lead and further to enhance the adherence between the dam bar and the lead on the lead frame.

In the present invention, the lead frame is constituted by a die pad and a plurality of leads. A gap is formed on the lead frame to allow the inner portion of the leads to be seperated from the tip portion of the die pad in a predetermined distance. Accordingly, a tape is attached and thus cover onto the bottom surface of the die pad and the bottom surface of the leads respectively, allowing the bottom side of the gap to be tightly sealed by the tape. A dam bar formed on the inner portion of the leads thereof is tightly sealed with each of the lead on the lead frame and with the tape underlying the leads respectively. The wire bonding area is positioned in a section of the lead frame between the inner portion of the leads and the dam bar. The die bonding area is positioned in the top surface of the die pad. The lead frame can be constituted only by a plurality of leads. The inner portion of the lead is seperated with a proper distance so as to be formed as a hollow portion. Therefore, after the semiconductor chip is attached to the die pad, the hollow portion is exactly inserted by the semiconductor chip for avoiding the delamination of the chip because of increasing the adhesive area between chip and lead frame. Now, the tape is adhered to the bottom surface of the lead frame with an area larger than the area of the hollow portion and the semiconductor chip. Therefore, after the dam bar is formed on a predetermined position of the lead frame, the wire bonding area of each lead frame for wire-bonding is enclosed inside the dam bar. In other words, in the lead frame formed by only leads, the die bonding area and the wire bonding area are positioned on a portion in which the leads concentrates towards the inner portion.

BRIEF DESCRIPTION OF DRAWINGS

The present invention may be fully understood by the following detailed description of the preferred embodiments, with reference to the appended drawings, wherein.

DETAILED DESCRIPTION OF PREFERRED EMBODIMENTS

The present invention will be described in the following in details with the appended figures, however, all these embodiments are not used to limit the scope of the present invention defined in the claims.

First Preferred Embodiment

Figure 1:
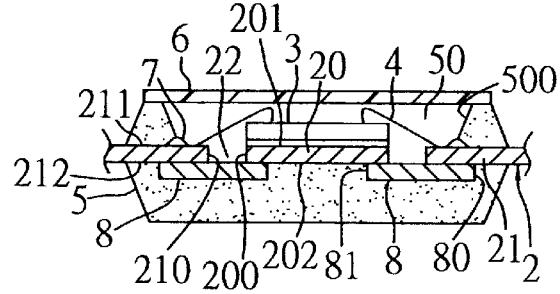
FIG. 1 is a cross-sectional view of the flash-free structure for the encapsulated semiconductor device having a flash-proof body according to a first preferred embodiment of the present invention.

FIG. 1 is a cross-sectional view showing the structure of the encapsulated semiconductor device having a flash-proof body according to a first embodiment of the present invention. As shown in FIG. 1, the encapsulated semiconductor deivce according to the present embodiment comprises: a lead frame 2; a semiconductor chip 3 mounted on the lead frame 2; gold wires 4 for electrically connecting to the semiconductor chip 3 and the lead frame 2; an encapsulation body 5 for partially encapsulating the lead frame 2; and a lid 6 for sealing on the top surface of the encapsulation body 5.

The lead frame 2 is made of a metal, such as copper, aluminum, copper alloy, aluminum alloy, and the like having preferred electrical conductivity. The lead frame 2 is constituted by a die pad 20 and a plurality of leads 21. The inner end of the lead 21 and the tip portion 200 of the die pad 20 are seperated with a proper distance so as to be formed as a gap 22, Meanwhile, the die pad 20 has a top surface 201 and an corresponding bottom surface 202. Each lead 21 has a top surface 211 and a corresponding bottom surface 212. The die pad 20 allows the semiconductor chip 3 attached to its top surface 201 by means of an adhesive e.g. silver paste or an adhesive tape. An encapsulation body 5 encapsulates the lead frame 2, allowing to form a core-hollowed portion 50 with the top surface 201 of the die pad 20 and part of the top surface 211 of the leads 21 being exposed therein, so that the semiconductor chip 3 and gold wires 4 are exposed in the core-hollowed portion 50 without being encapsulated. A lid 6 is then adhered bonded to the opening of the encapsulation body 5 so as to hermethically seal the whole core-hollowed portion 50 of the encapsulation body 5. The semiconductor chip 3 and gold wires 4 exposed within the core-hollowed portion 50 of the encapsulation body 5 are hermetically insulated from the exterior environment. This prevents the penetration of foreign particles and exterior humidity into the encapsulation body 5.

Referring to FIG. 1, a continuous dam bar 7 is formed on the edge of the side wall 500 of the core-hollowed portion 50 of the encapsulation body 5. Accordingly, a tape 8 is attached onto the bottom surface 202 of the die pad 20 and the bottom surface 212 of the lead 21 respectively, so that the bottom side of the gap 22 is tightly sealed by the tape 8. The dam bar 7 and tape 8 are formed as a flash-proof structure. As a result, the lead frame 2 having the flash-proof structure can prevent the occurrence of resin flash in the subsequent molding process. Furthermore, in the present embodiment, the width of the tape 8 is substantially larger than that between the tip portion 200 of the die pad 20 and the dam bar 7. Accordingly, the outer portion 80 of the tape 8 is protruding from the dam bar 7 as provided to prevent resin flow downwardly thereof during the dam bar 7 formation process, therefore the packaging facilities underlying the tape 8 are kept intact from the resin flash, In addition, the inner portion 81 the tape 8 is protruded from the tip portion 200 of die pad 20 and therefore the gap 22 is completed covered by the tape 8. Concrete examples of such tape mentioned above include polyimide or metal foil and the like. Preferred examples of the metal foil of the tape include copper, aluminum, copper alloy, aluminum alloy and the like. Moreover, the formation of the dam bar 7 can be carried out by conventional dispensing or screen printing techniques. The uppermost portion of dam bar 7 is substantially higher than the top surface 211 of the lead 21. The arrangement can further prevent the encapsulated resin from flowing over the dam bar 7 and to flow into the inner portion 210 of the lead 21. The resin material of the dam bar 7 include elastic materials such as silicone, epoxy resin, polyimide.

With reference to FIGS. 2A–2G, flow diagrams about the manufacturing steps in a first preferred embodiment of the present invention is illustrated.

Figure 2A:
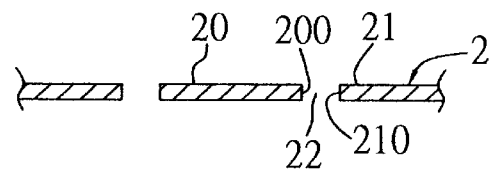
FIGS. 2A–2F are flow diagrams showing of the first preferred embodiment for the manufacturing method of the present invention.

Referring now to FIG. 2A, at first, a lead frame 2 with good electrical conductivity comprises a die pad 20 and a plurality of leads 21 formed at the periphery of the die pad 20. A gap 22 is formed between the inner portion 210 of the lead 21 and the tip portion 200 of the die pad 20.

Figure 2B:
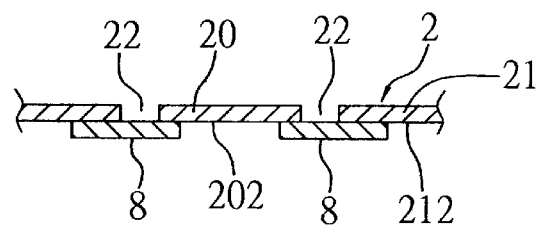

Further referring to FIG. 2B, each of the bottom surface 202 of the die pad 20 and the bottom surface 212 of the lead 21 is adhered with a tap 8, respectively so that the bottom of the gap 22 is completed sealed by the tape 8.

Figure 2C:
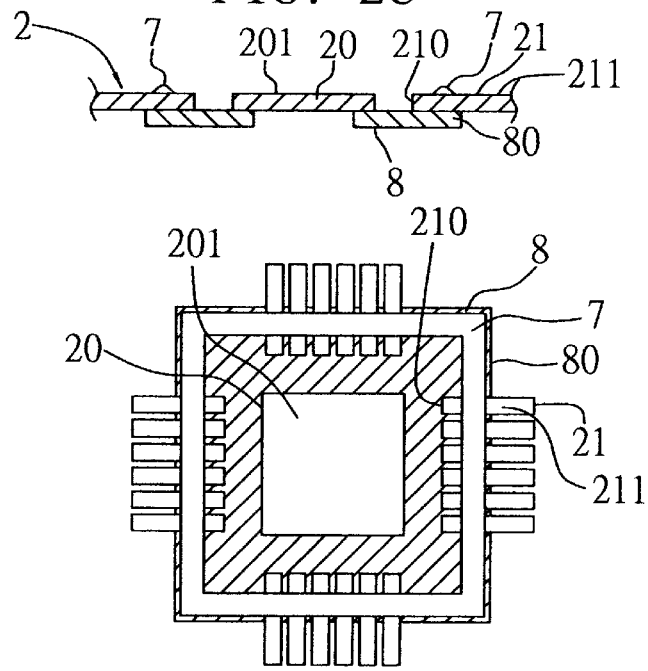

Furthermore, with reference to FIG. 2C, a dam bar 7 formed by conventional dispensing or screen printing techniques positioned on a predetermined section of the lead frame 2 in which the die pad 20 and inner portion 210 of the lead 21 are enclosed by the dam bar 7. The tape 8 is larger in dimension than the dam bar 7 with the outer portion 80 thereof being positioned outwards from the dam bar 7. Therefore, during the formation of the dam bar 7, the melted resin will adhere to the leads 21 and flow through the space between the adjacent leads 21. After the dam bar 7 is cured to be formed with a desired shape, the dam bar 7 will be adhered to the tape 8 so that top surface 211 of the lead 21 between the dam bar 7 and the inner portion 210 of the lead 21 is separated with the top surface 201 of the die pad 20 out of the tape 8 and the dam bar 7. In order that the adhereing relation between the dam bar 7, tape 8 and lead frame 2 are clear, FIG. 2C show a front view thereof.

Figure 2D:
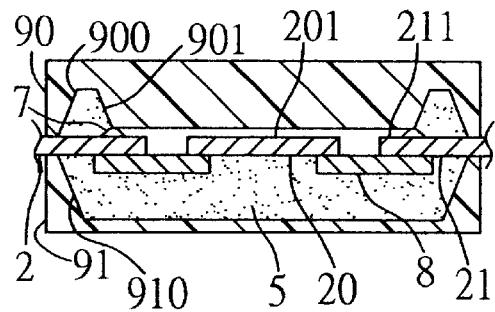

After the dam bar 7 is formed, it is further formed with a flash-proof body which can be positioned within a mold for performing a molding process. Referring to FIG. 2D, an encapsulating mold structure includes an upper mold 90 and a corresponded lower mold 91. Each of the upper mold 90 and lower mold 91 comprises a mold cavity 900 and 910, respectively, wherein the mold cavity 900 further comprises a core-hollowed forming block 901. After the upper mold 90 and lower mold 91 are compressed, the top edge of the core-hollowed forming block 901 will clamp against the dam bar 7. Since the dam bar 7 is elastic, after being clampped with the core-hollowed forming block 901, no melted resin will flow into the gap. Moreover, the bottom surface of the lead frame 2 is sealed by tape 8, the top surface 201 of the die pad 20 and the inside dam bar 7 for the top surface 211 of the lead 21 are flash-free. Furthermore, after the molding process, the present invention can keep a substantially resin flash-free region enclosed by the dam bar 7 including the top surface 201 of die pad 20 and the partical top surface 211 of the lead 21. As a result, the subsequent manufacturing process without the use of chemical solvent for post treating the lead frame. The present invention is achieved requiring no complicated production process, being cost-effective and being able to provide highly reliable semiconductor device.

Figure 2E:
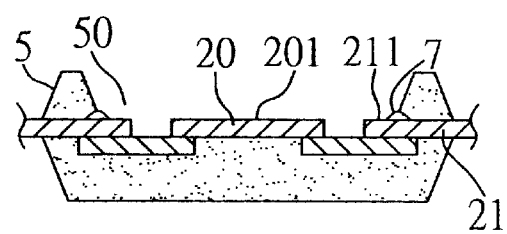

Referring to FIG. 2E, after the mold is removed and the molding process is completed, encapsulation body 5 having a core-hollowed portion 50 is formed. The region enclosed by the dam bar 7 including the top surface 201 of die pad 20 and the partial top surface 211 of the lead 21 is then exposed within the core-hollowed portion 50 of the encapsulation body.

Figure 2F:
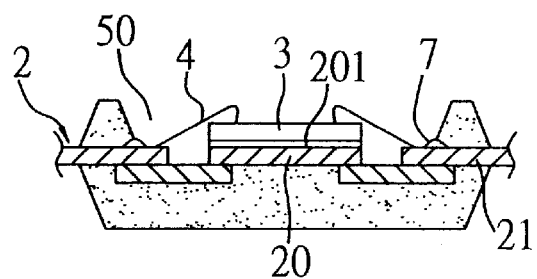

Next, a semiconductor ship 3 is adhered to the top surface 201 of the die pad 20 within the core-hollowed protion 50. Then, a wire bonding process is proceeded in the core-hollowed portion 50 so that the gold wire 4 is bonded to the lead 21 inside the dam bar 7 and the semiconductor chip 3, as shown in FIG. 2F.

Finally, referring to FIG. 1, a conventional lid 6 is adhered to the aforesaid encapsulation body 5 so as to seal hermetically the whole core-hollowed portion 50 of the encapsulation body 5. Therefore the semiconductor chip 3 and gold wires 4 integratred within the core-hollowed portion 50 of the encapsulation body are hermetically insulated from exterior environment.

The aforesaid three steps for producing the semiconductor device is provided at first by the component part manufacturer and then are transferred for performing a molding process. Thus the existing fabrication facilities and process can be retained without further implementing new facilities, thereby making the overall fabrication process cost-effective.

Figure 3:
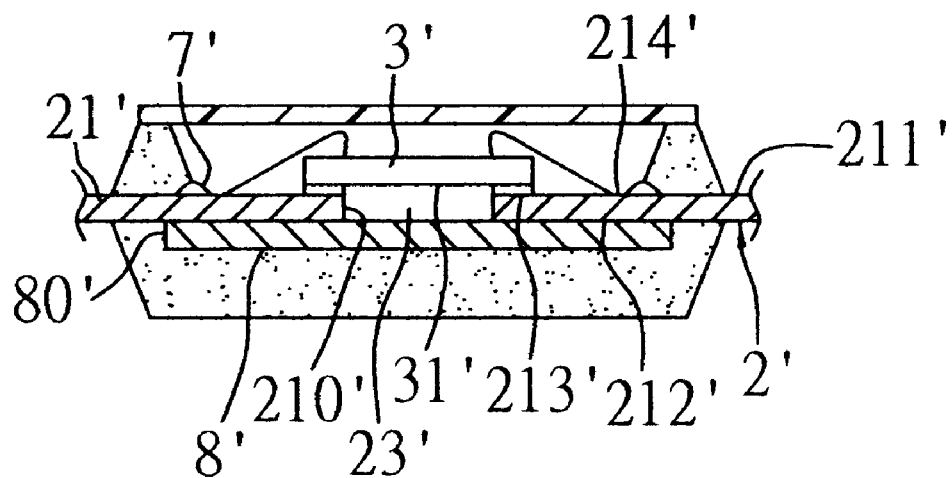
FIG. 3 is a cross-sectional view of a flash-free structure for the encapsulated semiconductor device according to a second preferred embodiment of the present invention.

FIG. 3 shows the structure for the encapsulated semiconductor having a flash-proof body according to a second preferred embodiment of the present invention. The structure of the present embodiment is similar to that in the first embodiment. In contrast to the first embodiment. In the present embodiment, the lead frame 2' is constituted by a plurality of leads 21'. The inner portion 210' of the lead 21' is faced and concentrated toward the inner side, thereby a hollowed portion 23' underlying the semiconductor chip 3' is formed. Only part of the bottom 31' of the semiconductor chip 3' is adhered to the top surface 211' of the lead 21' so as to prevent the delamination of the semiconductor chip 3' conventionally provided.

Since the semiconductor 3' is directly adhered to the lead 21', non-conductive adhesive or tape is used. Meanwhile, the top surface 211' of each lead 21' is formed with a chip bonding area 213' and wire bonding area 214' at the outer side of the chip bonding area 213'.

In the present invention, a flash-proof structure is formed, in which the bottom surface 212' of the lead 21' is adhered with a tape 8' so that the width of the tape 8' is larger than the distance between the wire bonding areas 214' of two opposite the lead 21' so that when the dam bar 7' is formed at the outer edge of the wire bonding area 214' of the lead 21', the dam bar 7' will adhere to the lead 21' and the tape 8' at the bottom surface of the lead 21'. Furthermore, when the dam bar 7' is formed, the resin formed with the dam bar 7' will not flow out of the outer portion 80' of the tape 8'. Meanwhile, after the tape 8' is attached and positioned in a predetermined section on the lead 2', and therefore completely seals the hollowed portion 23' and two adjacent leads 21' between the chip bonding area 213' and the wire bonding area 214'.

Figure 4:
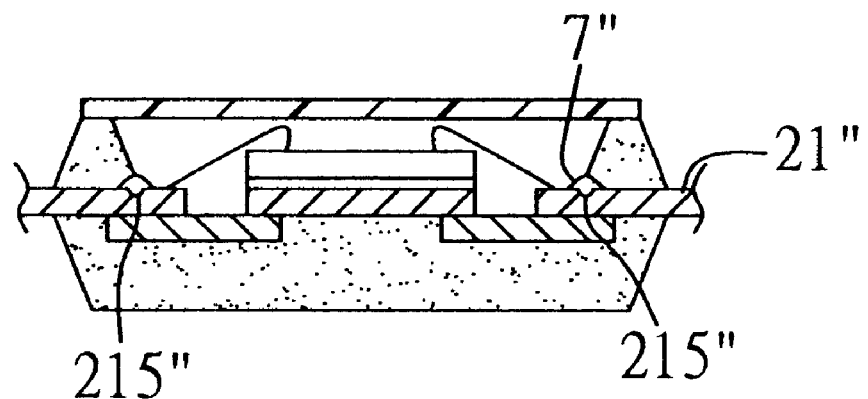
FIG. 4 is a cross-sectional view of the encapsulated semiconductor device having a flash-proof body according to a third preferred embodiment of the present invention.

FIG. 4 is cross-sectional view for the encapsulated semiconductor according to a third preferred embodiment of the present invention. The semiconductor package in the third embodiment is substantially similar to the first embodiment. The difference of this embodiment from the first embodiment is that a groove portion 215" formed by conventional etching techniques is positioned in a manner underlying the location of dam bar 7" on the lead 21". The groove portion 215" formed on the lead 21" according to the present invention is used to limit the range of the dam bar 7" and further to enhance the adherence between the dam bar 7" and the lead 21".

The invention has been described using exemplary preferred embodiment. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

We claim:

1. An encapsulated semiconductor device with flash-proof structure comprising:
   a lead frame including a top surface and a corresponding bottom surface, wherein a flash-proof body is formed on a predetermined section of said lead frame and composed of a dam bar formed on said top surface of said lead frame and a tape adhered to said bottom surface of said lead frame, with said dam bar being attached to both said lead frame and said tape, and wherein a die bonding area formed on said top surface of said lead frame is positioned inside said dam bar, and a wire bonding area formed on said top surface of said lead frame is positioned outside said die bonding area and inside said dam bar, such that said tape covers an area on said bottom surface of said lead frame corresponding in position to said wire bonding area and said die bonding area;

a semiconductor chip adhered on said die bonding area of said lead frame;

a plurality of conductive connecting elements for electrically connecting said semiconductor chip to said wire bonding area on said lead frame;

an encapsulation body having a core-hollowed portion integrated with said lead frame, wherein said core-hollowed portion is defined and bordered by said dam bar and said tape to allow said semiconductor chip and said conductive connecting elements to be received and exposed within said core-hollowed portion of said encapsulation body; and a lid adhered to said encapsulation body to hermetically seal said core-hollowed portion of said encapsulation body, wherein said semiconductor chip and said conductive connecting elements are air-tightly sealed within said core-hollowed portion.

2. The encapsulated semiconductor device with flash-proof structure according to claim 1, wherein said darn bar is formed on an outer edge of said wire bonding area on said lead frame.

3. The encapsulated semiconductor device with flash-proof structure according to claim 1, wherein said dam bar is protruded from said top surface of the lead frame.

4. The encapsulated semiconductor device with flash-proof structure according to claim 1, wherein said dam bar is in contact with a side wall of said core-hollowed portion of said encapsulation body.

5. The encapsulated semiconductor device with flash-proof structure according to claim 2, wherein an outer portion of said tape is protruded from said outer edge of said wire bonding area by a predetermined distance.

6. The encapsulated semiconductor device with flash-proof structure according to claim 1, wherein said lead frame is formed by a die pad and a plurality of leads.

7. The encapsulated semiconductor device with flash-proof structure according to claim 6, wherein an inner portion of each of said leads is separated from said die pad by a predetermined distance so as to form a gap therebetween.

8. The encapsulated semiconductor device with flash-proof structure according to claim 7, wherein said tape is attached onto said bottom surface of said lead frame and adhered to said die pad and said leads to cover said entire gap.

9. The encapsulated semiconductor device with flash-proof structure according to claim 7, wherein said dam bar is positioned on a predetermined section of said leads and adhered to each of said leads and said tape.

10. The encapsulated semiconductor device with flash-proof structure according to claim 1, wherein said lead frame is constituted by a plurality of leads.

11. The encapsulated semiconductor device with flash-proof structure according to claim 10, wherein inner portions of said leads are directed toward a central portion of said semiconductor chip so as to form a hollowed portion underlying said semiconductor chip.

12. The encapsulated semiconductor device with flash-proof structure according to claim 10, wherein said wire bonding area is located outside said die bonding area on said leads.

13. The encapsulated semiconductor device with flash-proof structure according to claim 11, wherein said tape seals said entire hollowed portion underlying said semiconductor chip after said tape is attached onto said bottom surface of said lead frame.

14. The encapsulated semiconductor device with flash-proof structure according to claim 6, wherein a groove portion is formed on said top surface of said lead frame corresponding to the location of said dam bar.

15. The encapsulated semiconductor device with flash-proof structure according to claim 14, wherein said groove portion is formed on each of said leads.

16. The encapsulated semiconductor device with flash-proof structure according to claim 1, wherein said conductive connecting elements are gold wires.

17. The encapsulated semiconductor device with flash-proof structure according to claim 1, wherein said dam bar is made of a material selected from the group consisting of silicone, epoxy resin and polyimide.

18. The encapsulated semiconductor device with flash-proof structure according to claim 1, wherein said tape is made of polyimide resin.

19. The encapsulated semiconductor device with flash-proof structure according to claim 1, wherein said tape is metal foil.

* * * * *